United States Patent [19]
Klein

[11] Patent Number: 5,958,065
[45] Date of Patent: Sep. 28, 1999

[54] CONTENT ADDRESSABLE BIT REPLACEMENT MEMORY

[75] Inventor: Dean A. Klein, Eagle, Id.

[73] Assignee: Micron Electronics, Inc., Nampa, Id.

[21] Appl. No.: 08/802,895

[22] Filed: Feb. 18, 1997

[51] Int. Cl.[6] .................................................. G11C 11/40
[52] U.S. Cl. .................................. 714/5; 714/8; 365/200; 365/230.03; 365/189
[58] Field of Search ......................... 395/182.03, 182.05, 395/182.06; 371/10.2; 365/200, 230.03, 189, 49; 711/108, 128

[56] References Cited

U.S. PATENT DOCUMENTS

| | | | |
|---|---|---|---|
| 3,633,175 | 1/1972 | Harper | 340/172.5 |
| 4,376,300 | 3/1983 | Tsang | 365/200 |
| 5,091,851 | 2/1992 | Shelton et al. | 711/128 |
| 5,278,793 | 1/1994 | Yeh | 365/200 |
| 5,719,804 | 2/1998 | Higaki | 365/49 |

*Primary Examiner*—Ly Hua
*Attorney, Agent, or Firm*—Arnold, White & Durkee

[57] ABSTRACT

A method of storing data to a defective memory device includes first receiving a memory address and a plurality of data bits. Next, a content addressable memory is interrogated with the memory address. Then, at least one data bit of the plurality of data bits is stored in the defective memory device. If the memory address is found in the content addressable memory, then at least one data bit of the plurality of data bits is stored in the content addressable memory.

31 Claims, 4 Drawing Sheets

CONTENT ADDRESSABLE BIT REPLACEMENT MEMORY

1. FIELD OF THE INVENTION

The invention relates in general to the field of computing, and more particularly, to compensating for defective memory locations in a memory device.

2. BACKGROUND OF THE INVENTION

Notwithstanding the power of modem microprocessors, such microprocessors can perform little, if any, work without reading and writing to external memory. When a microprocessor needs to access memory, it generates an address. The address corresponds to the particular location in memory that is of interest to the microprocessor. Most conventional memories are divided into rows and columns. The columns are formed by bit lines while the rows are formed by word lines. By specifying a row and a column, data that corresponds to the row and column may be read. Because the address generated by the microprocessor is not typically in a row/column format, a memory controller converts the microprocessor generated address into an address format that is suitable for a particular memory array.

During the fabrication of memories, one or more specific memory locations within a single memory device may become defective. If a microprocessor attempts to write data to a defective memory location, then the data may or may not be stored. For example, if the defective location is latched to the '1' state, then a '0' data bit could never be stored. Similarly, if a microprocessor attempts to read the data stored in the defective location, then the data read may or may not be accurate.

Conventional memory devices can contain millions of memory locations, only a few of which may be defective. A memory device that contains at least one defective location will be referred to as a defective memory device. In general, defective memory devices are discarded as unusable. Thus, a need exists for a memory controller that allows defective memory devices to be utilized.

3. SUMMARY OF INVENTION

A method of storing data to a defective memory device includes first receiving a memory address and a plurality of data bits. Next, a content addressable memory is interrogated with the memory address. Then, at least one data bit of the plurality of data bits is stored in the defective memory device. If the memory address is found in the content addressable memory, then at least one data bit of the plurality of data bits is stored in the content addressable memory.

4. BRIEF DESCRIPTION OF THE DRAWINGS

FIG. 1 presents a first embodiment of the invention.

FIG. 2 presents a method of operation of the first embodiment of the invention.

FIG. 3 presents a second embodiment of the invention.

FIG. 4 presents a method of operation of the second embodiment of the invention.

5. DETAILED DESCRIPTION OF SPECIFIC EMBODIMENTS

Illustrative embodiments of the invention are described below as it might be employed in the construction of a computer system for use with defective memory devices. In the interest of clarity, not all features of an actual implementation are described in this specification. It will of course be appreciated that in the development of any such actual embodiment numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill having the benefit of this disclosure.

5.1 Description of a First Embodiment

Figure 1:
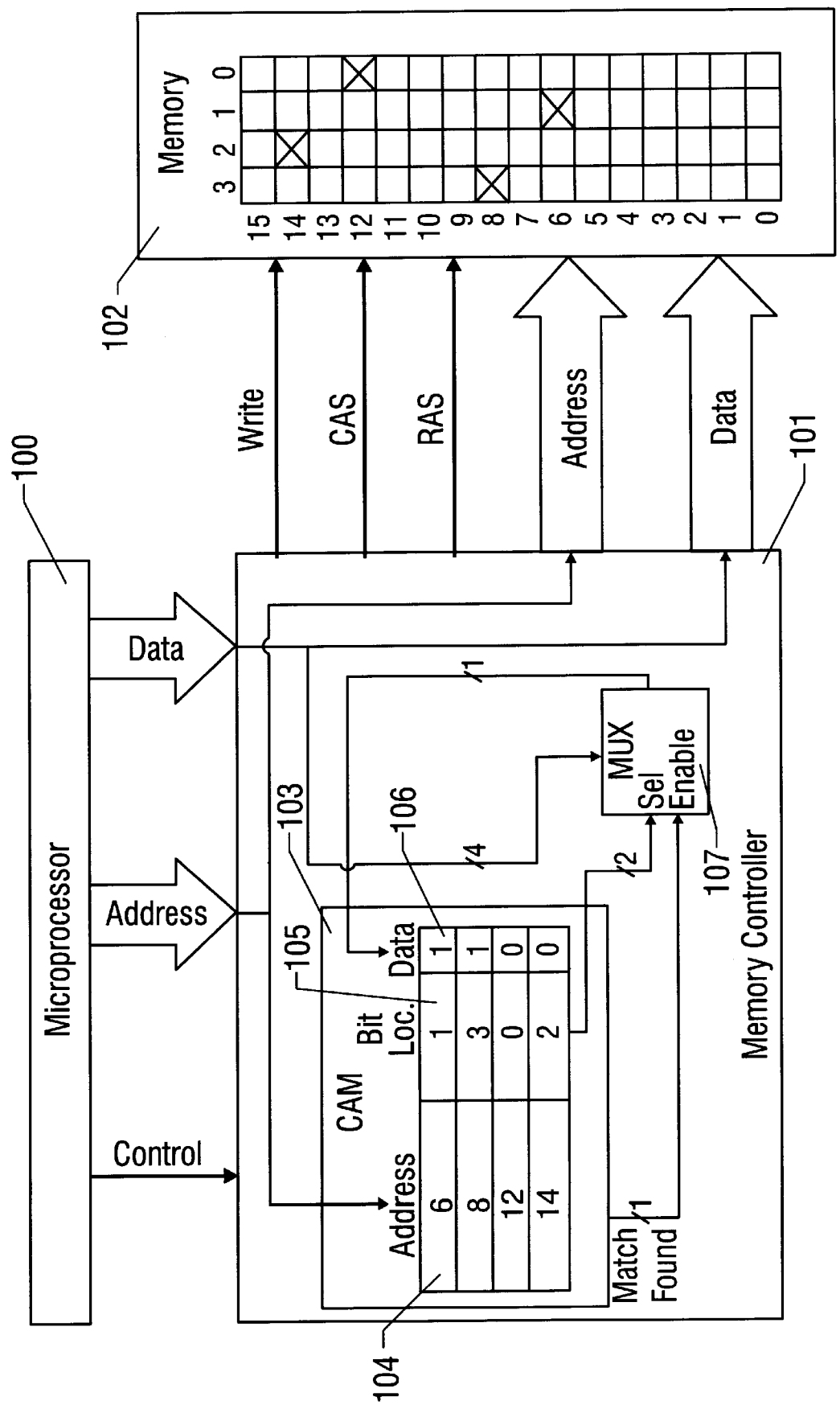

As shown in FIG. 1, one embodiment of the invention includes a microprocessor 100, a memory controller 101, and memory 102.

5.1.1 Microprocessor

The microprocessor 100 may be any conventional general purpose microprocessor such as a Pentium™ processor, a Pentium Pro™ processor, a 8051 processor, a MIPS processor, a Power PC™ processor, or a ALPHA™ processor. In addition, the microprocessor 100 may be any conventional special purpose microprocessor such as a digital signal processor or a graphics processor. As shown in FIG. 1, the microprocessor 100 has conventional address lines, conventional data lines, and one or more conventional control lines.

5.1.2 Memory

The memory 102 consists of one or more conventional memory devices such as DRAM (dynamic random access memory), EDO DRAM (extended data out DRAM), SRAM (static random access memory), or VRAM (video random access memory) devices. At least one of the conventional memory devices is a defective memory device. Recall that a defective memory device is a memory device that contains at least one defective memory location. FIG. 1 shows a single defective DRAM device that includes conventional Write, CAS (column address signal), and RAS (row address signal) inputs as well as conventional address and data lines. The simplified defective DRAM device shown in FIG. 1 contains 16 four bit addresses. Note that the first bit of the sixth address is marked with an 'x.' This marking indicates a defective memory location. Similarly, the third bit of the eighth address, the zero th bit of the 12th address, and the second bit of the fourteenth address are also defective memory locations.

If the memory 102 contains a plurality of memory devices, then a single address may map to different memory devices as is known in the art. Thus, in some circumstances, adjacent memory locations that correspond to an address may be in different memory devices.

5.1.3 Memory Controller

Referring again to FIG. 1, the memory controller 101 is conventionally coupled to the microprocessor 100. Specifically, the memory controller 101 is conventionally coupled to the microprocessor's address lines, data lines, and control lines.

The memory controller 101 is also conventionally coupled to memory 102 that contains at least one defective memory device. For example, as shown in FIG. 1, the memory controller 101 is conventionally coupled to the defective DRAM's Write, CAS, and RAS inputs as well as the DRAM's address lines and data lines.

As shown in FIG. 1, the memory controller 101 includes a content addressable memory 103 (CAM). CAMs are also known in the art as associative memories and as parallel-search memories. A CAM is a memory in which the storage locations are identified by a portion of or by all of their contents rather than by the storage locations' addresses. CAMs are rapidly interrogated and rapidly retrieve data elements.

An entry in the CAM 103 includes at least three fields. The first field, which is the address field 104, stores memory addresses that contain at least one defective memory location. As shown in FIG. 1, the CAM 103 contains address entries for addresses 6, 8, 12, and 14, because those addresses contain defective memory locations.

A CAM entry also includes a bit location field 105. The bit location field 105 stores the defective memory location for the address that is stored in the address field 104. As shown in FIG. 1, the bit location field 105 that corresponds to memory address 6 contains a '1' because the first memory location in memory address 6 is a defective memory location.

The CAM 103 also includes a data field 106. The data field 106 contains a data value for the defective memory location that is specified in the corresponding bit location field 105. The data field 106 is utilized to store the data value that would typically be stored in the defective memory location. In this embodiment, the data field 106 contains a single bit of data.

The address field 104 is the index field of the CAM 103. Thus, when the CAM 103 is interrogated with an address, then the CAM 103 will rapidly compare the address to all the addresses stored in the address fields 104. If a match is found, then the CAM 103 will retrieve the information stored in the bit location field 105 and/or the data field 106 that corresponds to the matching address field 104.

As shown in FIG. 1, the CAM 103 is coupled to the microprocessor's address lines. In one embodiment of the invention, the CAM 103 contains two outputs. The first CAM output, which will be referred to as a match-found output, indicates that an address match was found when the CAM 103 was interrogated with an address. The second output of the CAM 103, which will be referred to as a bit-location output, is the bit location value that corresponds to a matched address.

The two CAM outputs are coupled to a multiplexer 107. This multiplexer 107 will be referred to as a write multiplexer 107 because it is used when the microprocessor 100 writes data to an address that contains a defective memory location. The match-found output of the CAM 103 is coupled to the enable input of the write multiplexer 107. Similarly, the bit-location output of the CAM 103 is coupled to the select input of the write multiplexer 107. The data inputs of the write multiplexer 107 are coupled to the microprocessor's data lines and to the memory's data lines. The data output of the write multiplexer 107 is coupled to the data fields 106 of the CAM 103.

5.2 Method of Operation of the First Embodiment 5.2.1 Write to a Memory Address that Does Not Contain a Defective Memory Location Generally, when the microprocessor 100 writes to a memory address that does not contain a defective memory location, the memory controller 101 receives signals that indicate the microprocessor 100 is writing data to memory 102. Next, the memory address generated by the microprocessor 100 is used to interrogate the CAM 103. Because the address generated by the microprocessor 100 does not contain a defective memory location, an address match is not found and the memory controller 101 stores the microprocessor generated data in memory 102.

Figure 2:
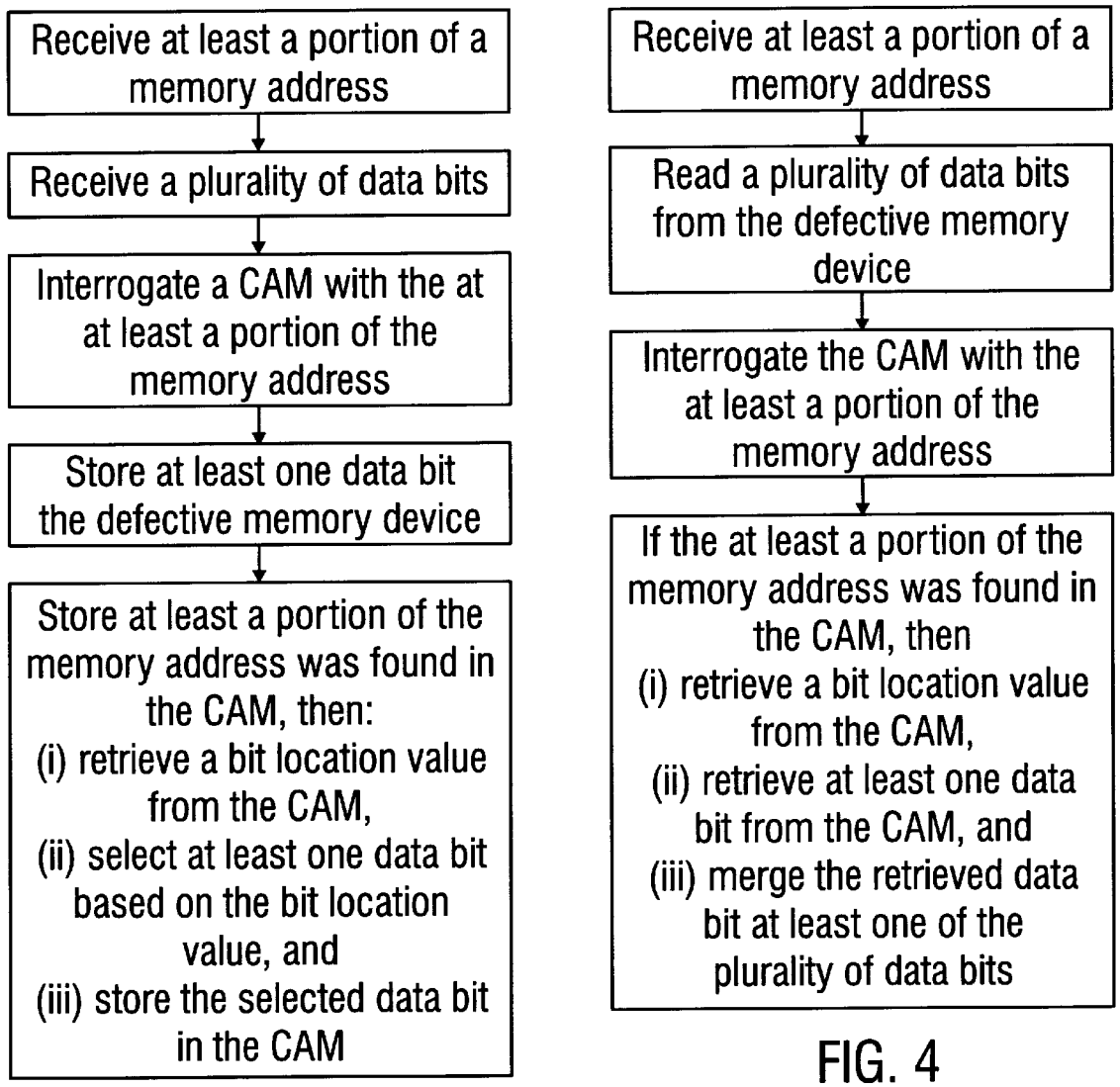

More specifically, consider that a computer program executing on the microprocessor 100 of FIG. 1 needs to write to memory address 5. Note that address 5 does not contain any defective memory locations. Upon initialization of a memory write, the microprocessor 100 conventionally outputs a memory address, the data to be written to the memory address, and control signals indicating that a memory write is occurring. As shown in FIG. 2, the memory controller 101 receives these signals and then uses the received memory address to interrogate the CAM 103. Because address 5 is not stored in the CAM 103, no address match is found and the match-found output of the CAM 103 disables the write multiplexer 107. The memory controller 101 then generates conventional Write, CAS, RAS, address, and data signals that cause the microprocessor generated data to be stored in the DRAM of FIG. 1.

5.2.2 Write to a Memory Address that Contains a Defective Memory Location

Generally, when a microprocessor 100 writes to a memory address that contains a defective memory location, the memory controller 101 receives signals that indicate the microprocessor 100 is writing data to memory 102. Next, the memory address generated by the microprocessor 100 is used to interrogate the CAM 103. Because the microprocessor generated address contains a defective memory location, an address match is found. The microprocessor generated data that corresponds to the defective memory location is then stored in the CAM 103. The remaining data bits are stored in memory 102.

More specifically, consider that a computer program executing on the microprocessor 100 of FIG. 1 needs to write to memory address 6. Note that the first memory location of address 6 is a defective memory location.

Upon initialization of a memory write, the microprocessor 100 conventionally outputs a memory address, the data to be written to that memory address, and control signals indicating that a memory write is occurring. Referring again to FIG. 2, the memory controller 101 receives these signals and then uses the received memory address to interrogate the CAM 103. Because address 6 is stored in the CAM 103, an address match is found.

Next, the value that is stored in the bit location field 105 that corresponds to the matching address field is retrieved. In this example, a 1 is retrieved. The retrieved value is then input into the select inputs of the write multiplexer 107 which is enabled with the match-found output of the CAM 103. Thus, based on the retrieved bit location value, a particular data bit received from the microprocessor 100 is selected and then stored in the CAM 103. In this example, the first bit of the data received from the microprocessor 100 is stored in the data field that corresponds to address 6.

The memory controller 101 then generates conventional Write, CAS, and RAS, address and data signals that cause the zero th, second, and third data bits of the microprocessor generated data to be stored in the DRAM of FIG. 1.

5.3 Description of a Second Embodiment

Figure 3:
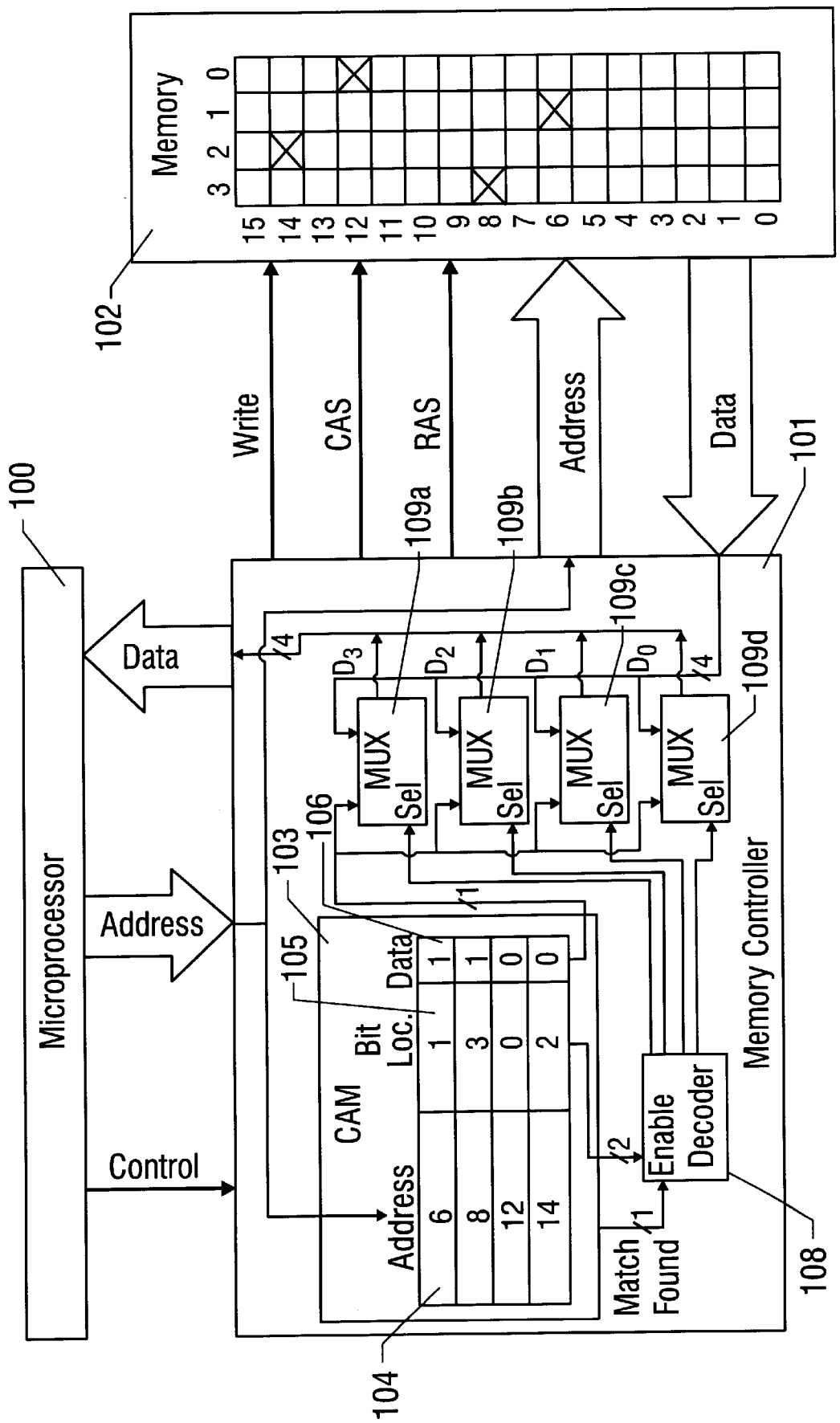
Figure 5:
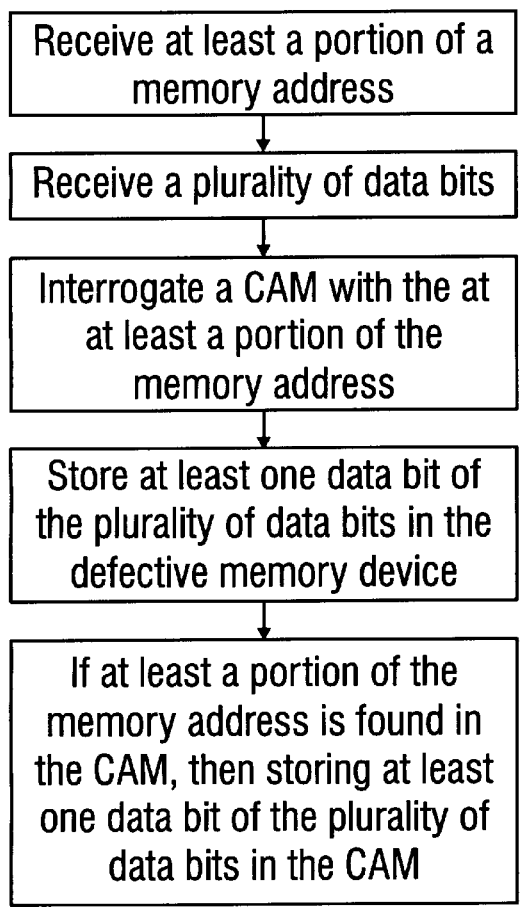
FIG. 5 illustrates one embodiment of a method of storing data to a defective memory device.
Figure 6:
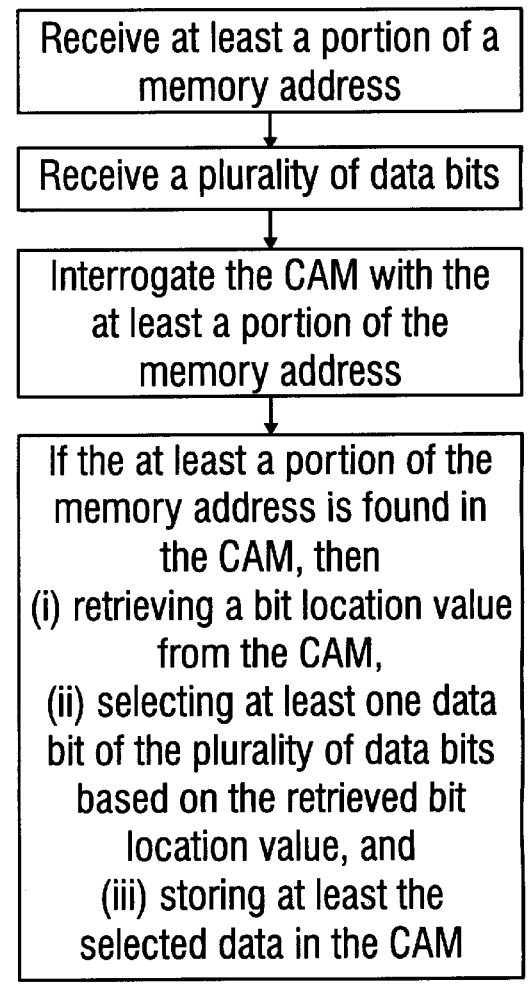
FIG. 6 illustrates one embodiment of a method of reading data from a defective memory device.

As shown in FIG. 3, a second embodiment of the invention also includes a microprocessor 101, a memory controller 101, and memory 102. The microprocessor 100 may be any conventional microprocessor discussed in Section 5.1.1. Similarly, the memory 102 may be any memory discussed in Section 5.1.2.

Referring to FIG. 3, the memory controller 101 contains a CAM 103 with at least an address field 104, a bit location field 105, and a data field 106. The CAM 103 is coupled to the microprocessor's address lines and contains three outputs: a match-found output, a bit location output, and a data output. The match-found output and the bit-location output were discussed in Section 5.1.3. The data output of the CAM 103 is the data value that is retrieved when an address match occurs. The match-found output is coupled to the enable input of a decoder 108. Similarly, the bit-location output is coupled to the data inputs of the decoder 108.

The data outputs of the decoder are coupled to the select inputs of a plurality of multiplexers 109a–d as shown in FIG. 3. These multiplexers 109a–d will be referred to as read multiplexers because they are utilized when the microprocessor 100 reads data from memory 102. In one embodiment of the invention, the data outputs of the decoders 108 are also coupled to conventional pull-down resistors. (The pull-down resistors are not shown in FIG. 3.) The data output of the CAM 103 is coupled to a data input of the read multiplexers 109a–d. The other data inputs of the read multiplexers 109a–d are coupled to the memory data lines as shown in FIG. 3. The data outputs of the read multiplexers 109a–d are coupled to the microprocessor data lines.

5.4 Method of Operation of the Second Embodiment
5.4.1 Read from a Memory Address that Does Not Contain a Defective Memory Location Generally, when the microprocessor 100 requests a read from a memory address that does not contain a defective memory location, the memory controller 101 receives signals that indicate the microprocessor 100 is requesting the memory controller 101 to read data from memory 102. Next, the memory controller 101 reads the requested data from the memory 102. Then, the memory address generated by the microprocessor 100 is used to interrogate the CAM 103. Because the address generated by the microprocessor 100 does not contain a defective memory location, an address match is not found. Therefore, the data that was previously read from the memory 102 is outputted to the microprocessor 101.

More specifically, consider that a computer program executing on the microprocessor 100 of FIG. 3 needs to read the data stored in memory address 5. Note that address 5 does not contain any defective memory locations.

Upon initialization of a request for a memory read, the microprocessor 100 conventionally outputs a memory address and control signals indicating that a memory read is requested. Referring to FIG. 4, the memory controller 101 receives the memory address. The memory controller 101 then generates CAS, RAS, and address signals and reads the requested data from the memory 102.

The memory controller 101 also uses the memory address received from the microprocessor 100 to interrogate the CAM 103. Because address 5 is not stored in the CAM 103, no address match is found and the match-found output of the CAM 103 disables the decoder 108. Because the data outputs of the decoder 108 are then held low by the pull-down resistors, the read multiplexers 109a–d output the 4 bits of data that were previously read from the memory 102. The memory controller 101 then outputs the 4 bits of data to the microprocessor 100.

5.4.2 Read from a Memory Address that Contains a Defective Memory Location

Generally, when the microprocessor 100 requests a read from a memory address that contains a defective memory location, the memory controller 101 receives signals that indicate the microprocessor 100 is requesting the memory controller 101 to read data from memory 102. Next, the memory controller 101 reads the data stored in memory 102 at the microprocessor generated address. This data includes at least one bit of data that corresponds to a defective memory location. Then, the memory address generated by the microprocessor 100 is used to interrogate the CAM 103. Because the address generated by the microprocessor 100 contains a defective memory location, an address match is found. The data value that corresponds to the matched address is then retrieved from the CAM 103 and merged with the data read from memory 102. The resulting data is then outputted to the microprocessor 100.

More specifically, consider that a computer program executing on the microprocessor 100 of FIG. 3 needs to read the data stored in memory address 6. Note that the first memory location of address 6 contains a defective memory location.

Upon initialization of a request for a memory read, the microprocessor 100 conventionally outputs a memory address and control signals indicating that a memory read is requested. Referring to FIG. 4, the memory controller 101 receives the memory address. The memory controller 101 then generates CAS, RAS, and address signals to read the requested data from the memory 102.

Next, the memory controller 101 interrogates the CAM 103 with the memory address received from the microprocessor 100. Because address 6 is stored in the CAM 103, an address match is found, the bit location value and the data value that correspond to address 6 are retrieved, and the decoder 108 is enabled by the CAM's match-found output. In this example, because the retrieved bit location is '1,' the first decoder data output will be high and the zero th, second, and third decoder data outputs will be low. Thus, the data value that is stored in the data field 106 that corresponds to the matched address will be merged with the other data values read from the memory 102. Specifically, the zero th, second, and third bits of data read from the memory 102 will be merged with the data value stored in the data field 106 that corresponds to address 6. The resulting merged data will then be outputted to the microprocessor 100.

5.5 Alternative Embodiments

In the above described embodiment, the data field 106 of the CAM 103 stores a single data bit. However, in other embodiments, the data field 106 may store two or more bits. For example, the data field 106 of the CAM 103 may store any subset of the bits that form a memory word.

In one embodiment, the bit location field 105 may indicate the location of the first bit of data that is stored in the data field 106 of the CAM 103. Alternatively, the bit location field 105 may indicate the location of the last bit of data that is stored in the data field 106 of the CAM 103.

In still another embodiment, the bit location field 105 may indicate the bit slice of the memory word. For example, consider a 16 bit memory word that is divided into four 4-bit slices. In this example, one of the bit slices would be stored in the data field of the CAM. Thus, a '2' in the bit location field 105 could indicate that the bit slice that is stored in the data field would be merged with the zero th, first, and third bit slices of data that is read from or written to memory 102. In still another embodiment, the data field 106 of the CAM 103 may store a byte of data. In this embodiment, the bit location field 105 would indicate the byte of data that is to be merged with data that is read from or written to memory 102.

The embodiments discussed above utilize conventional Write, RAS, and CAS signals to read from and write to memory 102. However, in other embodiments, the memory controller 101 may utilize higher performance memory operational modes such as the fast serial access mode that is known by those skilled in the art as nibble mode.

In some embodiments the CAM 103 is interrogated with the entire address received from the microprocessor 100. However, in other embodiments, the CAM 103 may also be interrogated with only a portion of the address received from the microprocessor 100. For example, if the memory controller 101 receives a 32-bit address, the CAM 103 may be interrogated with a 16-bit address, a 8-bit address, or even a 4-bit address.

5.6 Remarks

The primary advantage of the invention is that it allows efficient use of defective memory devices which otherwise may be discarded as scrap devices. Thus, significant cost savings may be attained by utilizing such defective memory devices.

While other techniques exist for using a defective memory, the invention maximizes the usage of the defective memory device. This advantage is commercially valuable especially when only a small number of random failures are scattered throughout a defective memory device.

It will be appreciated by those of ordinary skill in the art having the benefit of this disclosure will appreciate that numerous variations from the foregoing illustration will be possible without departing from the inventive concept described therein. Accordingly, it is the claims set forth below, and not merely the foregoing illustration, which are intended to define the exclusive rights claimed in this application program.

What is claimed is:

1. A method of storing data to a defective memory device comprising:
   (a) receiving at least a portion of a memory address;
   (b) receiving a plurality of data bits;
   (c) interrogating a content addressable memory with the at least a portion of the memory address;
   (d) storing at least one data bit of the plurality of data bits in the defective memory device; and
   (e) if the at least a portion of the memory address is found in the content addressable memory, then storing at least one data bit of the plurality of data bits in the content addressable memory.

2. The method of claim 1 wherein the act of storing at least one data bit of the plurality of data bits in the content addressable memory includes storing two data bits of the plurality of data bits in the content addressable memory.

3. The method of claim 1 wherein the act of storing at least one data bit of the plurality of data bits in the content addressable memory includes storing four data bits of the plurality of data bits in the content addressable memory.

4. The method of claim 1 wherein the act of storing at least one data bit of the plurality of data bits in the defective memory device includes storing at least one data bit of the plurality of data bits in a DRAM device.

5. The method of claim 1 wherein the act of storing at least one data bit of the plurality of data bits in the defective memory device includes storing at least one data bit of the plurality of data bits in an EDO DRAM device.

6. The method of claim 1 wherein the act of storing at least one data bit of the plurality of data bits in the defective memory device includes storing at least one data bit of the plurality of data bits in a SRAM device.

7. The method of claim 1 wherein the act of storing at least one data bit of the plurality of data bits in the defective memory device includes storing at least one data bit of the plurality of data bits in a VRAM device.

8. The method of claim 1, wherein the at least one data bit stored in the content addressable memory is stored for merger with the remaining plurality of data bits in a subsequent read from the defective memory device.

9. A method of storing data to a defective memory device comprising:
   (a) receiving at least a portion of a memory address;
   (b) receiving a plurality of data bits;
   (c) interrogating a content addressable memory with the at least a portion of the memory address;
   (d) storing at least one data bit of the plurality of data bits in the defective memory device; and
   (e) if the at least a portion of the memory address is found in the content addressable memory, then
      (i) retrieving a bit location value from the content addressable memory,
      (ii) selecting at least one data bit, referred to as a selected data bit, of the plurality of data bits based on the retrieved bit location value, and
      (iii) storing at least the selected data bit in the content addressable memory.

10. The method of claim 9 wherein the act of storing at least the selected data bit in the content addressable memory includes storing two data bits in the content addressable memory.

11. The method of claim 9 wherein the act of storing at least the selected data bit in the content addressable memory includes storing four data bits in the content addressable memory.

12. The method of claim 9 wherein the act of storing at least one data bit of the plurality of data bits in the defective memory device includes storing at least one data bit of the plurality of data bits in a DRAM device.

13. The method of claim 9 wherein the act of storing at least one data bit of the plurality of data bits in the defective memory device includes storing at least one data bit of the plurality of data bits in an EDO DRAM device.

14. The method of claim 9 wherein the act of storing at least one data bit of the plurality of data bits in the defective memory device includes storing at least one data bit of the plurality of data bits in a SRAM device.

15. The method of claim 9 wherein the act of storing at least one data bit of the plurality of data bits in the defective memory device includes storing at least one data bit of the plurality of data bits in a VRAM device.

16. The method of claim 9, wherein the at least one data bit stored in the content addressable memory is stored for merger with the remaining plurality of data bits in a subsequent read from the defective memory device.

17. A method of reading data from a defective memory device comprising:
   (a) receiving at least a portion of a memory address;
   (b) reading a plurality of data bits from the defective memory device;
   (c) interrogating a content addressable memory with the at least a portion of the memory address; and
   (d) if the at least a portion of the memory address is found in the content addressable memory, then retrieving at least one data bit, referred to as a retrieved data bit, from the content addressable memory.

18. The method of claim 17 further including:
   (e) if the at least a portion of the memory address is found in the content addressable memory, then merging the retrieved data bit with at least one of the plurality of data bits.

19. The method of claim 18 further including:
   (f) outputting the retrieved data bit and at least one of the plurality of data bits.

20. The method of claim 17 wherein the act of reading a plurality of data bits from the defective memory device includes reading a plurality of data bits from a DRAM device.

21. The method of claim 17 wherein the act of reading a plurality of data bits from the defective memory device includes reading a plurality of data bits from an EDO DRAM device.

22. The method of claim 17 wherein the act of reading a plurality of data bits from the defective memory device includes reading a plurality of data bits from a SRAM device.

23. The method of claim 17 wherein the act of reading a plurality of data bits from the defective memory device includes reading a plurality of data bits from a VRAM device.

24. A method of reading data from a defective memory device comprising:
   (a) receiving at least a portion of the memory address;
   (b) reading a plurality of data bits from the defective memory device;
   (c) interrogating a content addressable memory with the at least a portion of the memory address; and
   (d) if the at least a portion of the memory address is found in the content addressable memory, then
      (i) retrieving a bit location value from the content addressable memory,
      (ii) retrieving at least one data bit, referred to as a retrieved data bit, from the content addressable memory, and
      (iii) merging the retrieved data bit with at least one of the plurality of data bits.

25. The method of claim 22 further including:
   (e) outputting the retrieved data bit and at least one of the plurality of data bits.

26. The method of claim 22 wherein the act of reading a plurality of data bits from the defective memory device includes reading a plurality of data bits from a DRAM device.

27. The method of claim 24 wherein the act of reading a plurality of data bits from the defective memory device includes reading a plurality of data bits from an EDO DRAM device.

28. The method of claim 24 wherein the act of reading a plurality of data bits from the defective memory device includes reading a plurality of data bits from a SRAM device.

29. The method of claim 24 wherein the act of reading a plurality of data bits from the defective memory device includes reading a plurality of data bits from a VRAM device.

30. A method of reading data from a defective memory device comprising:
   (a) receiving at least a portion of a memory address;
   (b) reading a plurality of data bits from the defective memory device;
   (c) interrogating a content addressable memory with the at least a portion of the memory address;
   (d) if the at least a portion of the memory address is found in the content addressable memory, then retrieving at least one data bit, referred to as a retrieved data bit, from the content addressable memory; and
   (e) if the at least a portion of the memory address is found in the content addressable memory, then merging the retrieved data bit with at least one of the plurality of data bits.

31. The method of claim 30, further including:
   (f) outputting the retrieved data bit and at least one of the plurality of data bits.

* * * * *